United States Patent [19]

Kardashian et al.

[11] Patent Number: 4,490,457
[45] Date of Patent: Dec. 25, 1984

[54] COLD/DRY SUBSTRATE TREATMENT TECHNIQUE WHICH IMPROVES PHOTOLITHOGRAPHIC LIMITS OF RESOLUTION AND EXPOSURE TOLERANCE

[75] Inventors: Vahram S. Kardashian, Plymouth; Richard D. Benson, Minneapolis, both of Minn.

[73] Assignee: Honeywell Inc., Minneapolis, Minn.

[21] Appl. No.: 332,269

[22] Filed: Dec. 18, 1981

Related U.S. Application Data

[62] Division of Ser. No. 210,970, Nov. 28, 1980, abandoned.

[51] Int. Cl.³ .............................................. G03C 5/00
[52] U.S. Cl. ..................................... 430/311; 430/271; 430/272; 430/315; 430/935; 430/312; 174/68.5
[58] Field of Search ............... 430/271, 272, 311, 315, 430/935, 312; 174/68.5

[56] References Cited

U.S. PATENT DOCUMENTS

| | | | |
|---|---|---|---|
| 3,606,679 | 9/1971 | Schroeder | 96/36.2 |
| 3,873,313 | 3/1975 | Horst et al. | 430/312 |
| 4,064,287 | 12/1977 | Lipson et al. | 427/53 |
| 4,167,413 | 9/1979 | Christ et al. | 427/238 |

*Primary Examiner*—Jack P. Brammer
*Attorney, Agent, or Firm*—Omund R. Dahle

[57] ABSTRACT

A limitation in the use of ceramic substrates for electronic packaging is that photolithographic processes applied to such substrate surfaces do not give the highest resolution that the process is capable of because of inherent surface topographical variations on the ceramic substrate. A smoothing layer of a dry film glazed photosensitive material, such as RISTON solder mask, is laminated over the substrate surface, exposed with UV and cured. Metal conductor lines are then bonded onto the surface of the solder mask layer.

4 Claims, 3 Drawing Figures

COLD/DRY SUBSTRATE TREATMENT TECHNIQUE WHICH IMPROVES PHOTOLITHOGRAPHIC LIMITS OF RESOLUTION AND EXPOSURE TOLERANCE

This is a continuation of application Ser. No. 210,970, filed Nov. 28, 1980, now abandoned.

BACKGROUND AND SUMMARY OF THE INVENTION

The present invention falls into the general category of electronic packaging and more specifically into processes meeting high density line requirements on ceramic substrates utilized in electronic packages.

Ceramic substrates such as alumina possess an inherent surface topographical variation, the peak to valley distance falling in the range of 4–7 μm. Photolithographic processes applied to such surfaces do not give the highest resolution that the process is capable of. In addition, such surfaces can result in defects in the photoresist applied to the substrate surface. Chemical development of the photoresist often produces pinholes or regions of unetched photoresist. Consequently metallization of the substrate results in metallized islands at the location of the pinholes and "opens" at the location of unetched photoresist. As finer (i.e. narrower) metallized lines are made, the condition of the lines become worse. In addition to ceramic substrates, the surface problem also exists with printed circuit boards and porcelainized steel.

In the prior art there has been the use of the process of glazing of an alumina surface to provide a smoother surface, however this is a hot process utilizing temperatures of 600° C.–950° C.

The improvement comprises laminating over the substrate surface a dry film photosensitive material that withstands temperatures of molten solder and has a thickness of about 10 μm or greater such as RISTON solder mask. The lamination is a dry process which laminates the solder mask in sheet form onto the substrate surface by pressure at a temperature around 100° C. The solder mask may then be cured by exposure to UV light. The surface irregularities of the solder mask will be much smaller than those of the substrate therefore providing a comparatively flat surface upon which to place a layer of photosensitive resist. Thus there is provided an inexpensive process in the laminating of the solder mask which is considered both dry and cold and hence is technologically very desirable in manufacturing.

DESCRIPTION

Figure 1:
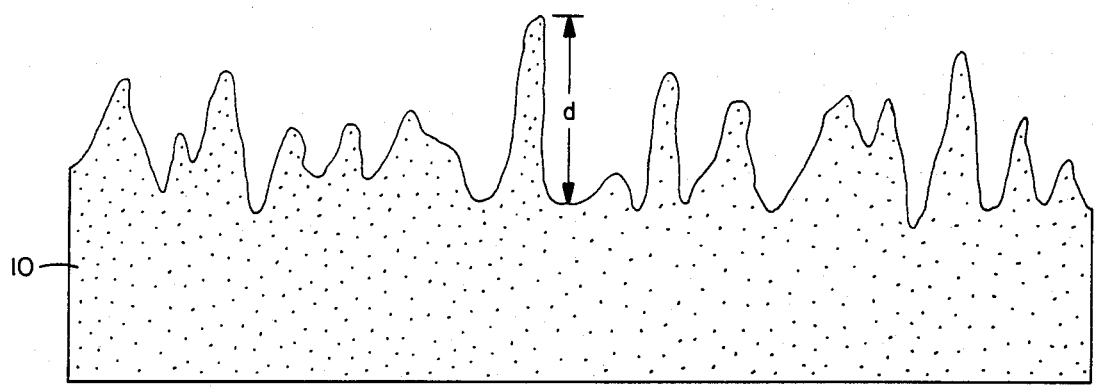
FIG. 1 is a magnified representation of the surface undulations of an alumina substrate.
Figure 2:
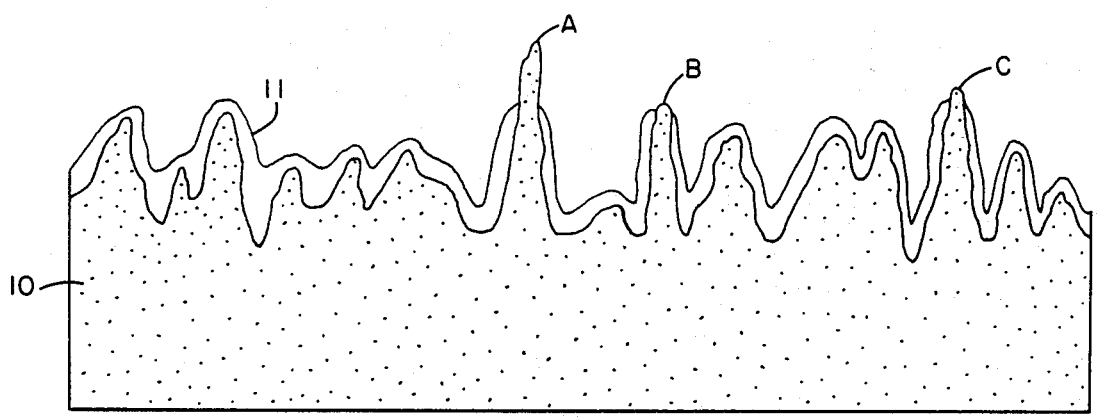
FIG. 2 is a diagrammatic representation of prior art application of a conventional liquid photoresist onto the surface of the alumina substrate of FIG. 1.

The use of ceramic substrates in electronic packaging is desirable for a number of reasons. Electronic substrates of ceramic, however, possess an inherent surface topographical variation which may be in the peak-to-valley magnitude of around 4 to 7 μm and which presents a limitation in that photolithographic processes applied to such surfaces do not give the highest resolution that the process is capable of. FIG. 1 is a greatly magnified representation of the surface of an alumina substrate 10 wherein the distance "d" represents the peak-to-valley distance and may be on the order of 4–7 μm. In the prior art such as shown in FIG. 2, the substrate 10 has been covered with a layer of liquid resist 11 and at the peaks identified as A, B and C, a pin hole exists in the resist. As a result when the layer is metallized an extra spot of metal will be deposited at these points. These unwanted pin hole metallizations can cause electrical shorts.

Photoresist formulations generally consist of three of four components, namely a film-forming resin, a solvent system, sensitizers and additives. Although it is possible that the resin is intrinsically photosensitive, sensitizers or photoinitiators absorb short wavelength light energy and cause the dried film to increase or decrease its chemical resistance to a developing agent. If the exposed areas of the resist are hardened by UV exposure, the resist is referred to as negative acting. If exposed areas are solubilized instead, the resist is positive acting. The additives consist generally of anti-oxidants and stabilizers. A second classification of resist materials differentiate resists into wet film or dry film resists. The dry film resists on the market, until recently, are negative acting because the exposed portions of the photopolymer resist harden to form the insoluble resin. Therefore, photoresists are here classified as negative or positive acting, and wet film or dry film type.

Figure 3:
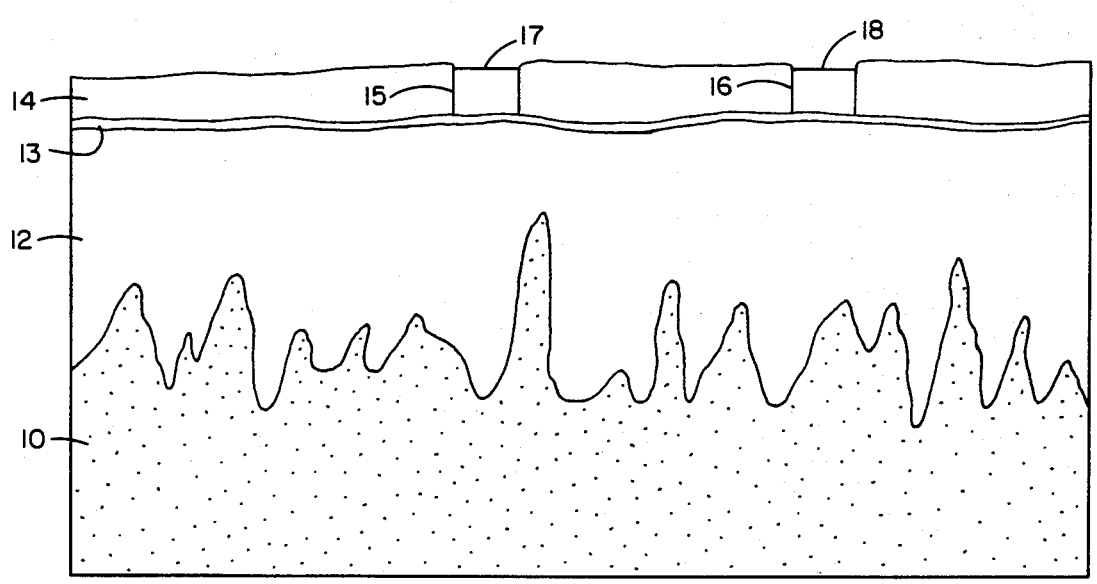
FIG. 3 shows the improved substrate surface with the addition of the laminated smoothing dry film photosensitive material.

FIG. 3 shows the alumina substrate 10 having its surface covered with a smoothing film layer 12 of dry film photosensitive material that withstands temperatures of molten solder, such as for example, negative acting RISTON SOLDER MASK. RISTON is a registered trademark of the EI Dupont deNemours Co. RISTON solder mask which is available from Dupont in films of 2, 3 and 4 mils thickness is a dry film photosensitive polymer dielectric mask having a high electrical resistance and a low dielectric constant which withstands temperatures of various molten solders without degradation. The process of applying the RISTON comprises laminating the film over the substrate surface. The lamination process is a dry process which laminates the solder mask, in sheet film form, onto the substrate by pressure solder mask, in sheet film form, onto the substrate by pressure at a temperature around 100° C. The laminating is preferably by a roller type of laminator. The solder mask is then cured and hardened by uniform exposure of the surface UV light, and the hardened solder mask remains on the finished electronic substrate.

SEM (Scanning electron microscope) views of the RISTON solder mask surface show the laminated solder mask surface to be very smooth in comparison to the substrate surface. The surface roughness is reduced by at least an order of magnitude over that of the substrate. In one successful embodiment the solder mask was RISTON 720FR solder mask with a thickness on the order of 40–50 μm which provided desirable electrical properties in that its insulation resistance is high and its dielectric constant is low (K=2.5). The solder mask 12 is then coated by a very thin layer 13, e.g. 1000 Å, of metallalizing material such as Cr/Au or Cr/Cu. This may be done by sputtering. Over the layer 13 there is applied a layer 14 of photoresist, preferably a positive resist, onto which an image is developed. Specifically, the resist 14 may be exposed to a collimated source of UV light (not shown). A photomask between the light source and the resist imprints a virtual image on the resist. Development of the resist by appropriate developers produces positive or negative images by removal of resist from specified areas 15 and 16. The removed portions of resist expose the underlying metallization layer 13. This is followed by the metallization process (e.g. electroplating 17 and 18 of the exposed metallization layer in an appropriate plating solution for gold or copper. Electroplated conductors 17 and 18 are much thicker than the layer 13 and may be plated to around $10^5$ angstroms. The layer 13 only function is to make it possible to electroplate the conductor lines. Following the electroplating there is a total stripping of the resist 14 adhering to the metallized substrate by the solvent action of strippers specified by the resist manufacture leaving only a metallization layer 13 and conductors 17 and 18 over a solder mask layer on top of the substrate. A surface etching removes the thin layer 13 so that only the conductors 17 and 18 remain on the RISTON solder mask.

The embodiments of the invention in which an exclusive property or right is claimed are defined as follows:

1. In electronic packaging, a process for improving photolithographic limits of resolution on a ceramic substrate, the steps comprising:

providing a ceramic substrate upon which high density conductive lines are to be placed, the substrate presenting a limitation to the application of high density lines in that it inherently possesses a surface topographical variation on the order of 4–7 $\mu$m;

bonding a smoothing layer of a dry film polymer dielectric material which material is photosensitive before exposure that withstands temperatures of molten solder to at least one surface of said substrate, the surface of said layer remote from the substrate being smooth by comparison with the surface of the substrate; and coating metal conductor lines onto the surface of said layer.

2. The process of claim 1 wherein the dry film photosensitive material is RISTON solder mask.

3. The process of claim 2 wherein the step of bonding a smoothing layer of RISTON solder mask includes the further step of:

exposing to UV light the RISTON solder mask layer to cure and harden the layer.

4. The process of claim 1 or 3 wherein the step of bonding metal conductor lines includes the additional preliminary steps of:

depositing a layer of a different photoresist onto the surface of the dry film polymer dielectric material layer;

masking, imaging, exposure to UV and developing the photoresist and the additional subsequent step to bonding metal conductor lines of stripping the remaining photoresist from the surface of the dry film material layer.

* * * * *